United States Patent
Preti

(10) Patent No.: US 6,579,361 B2
(45) Date of Patent: Jun. 17, 2003

(54) CHEMICAL VAPOR DEPOSITION EPITAXIAL REACTOR HAVING TWO REACTION CHAMBERS ALTERNATIVELY ACTUATED AND ACTUATING METHOD THEREOF

(75) Inventor: Franco Preti, Bollate (IT)

(73) Assignee: LPE SpA, Milan (IT)

( * ) Notice: Subject to any disclaimer, the term of this patent is extended or adjusted under 35 U.S.C. 154(b) by 0 days.

(21) Appl. No.: 09/932,255

(22) Filed: Aug. 16, 2001

(65) Prior Publication Data

US 2002/0112661 A1 Aug. 22, 2002

Related U.S. Application Data

(63) Continuation-in-part of application No. 09/452,840, filed on Dec. 2, 1999, now abandoned.

(51) Int. Cl.[7] .............................................. C30B 35/00
(52) U.S. Cl. ........................ 117/200; 117/204; 117/900
(58) Field of Search ............................... 117/200, 204, 117/900

Primary Examiner—Felisa Hiteshew
(74) Attorney, Agent, or Firm—Perkins Coie LLP

(57) ABSTRACT

Chemical vapor deposition epitaxial reactor comprising two reaction chambers, each provided with a susceptor, enclosed in a bell jar, to be induction heated by an induction coil supplied by a medium frequency AC generator, and generator means for providing a medium frequency power supply to the two induction coils of both the reaction chambers, wherein the means for power supplying the two induction coils are alternatively actuated, so that when one of the reaction chambers is heated the other one is purged, loaded and/or unloaded, providing however a time overlap of 1 to 10 minutes between the heating times of the two processes. A computerized controller provides to control the medium frequency generators in accordance with a dedicated software for providing an actuating method to the specific reactor.

14 Claims, 5 Drawing Sheets

CHEMICAL VAPOR DEPOSITION EPITAXIAL REACTOR HAVING TWO REACTION CHAMBERS ALTERNATIVELY ACTUATED AND ACTUATING METHOD THEREOF

This application is a Continuation-in-part of prior application Ser. No. 09/452,840, filed Dec. 2, 1999, from which priority under 35 U.S.C. §120 is claimed now abandoned.

BACKGROUND OF THE INVENTION

The present invention relates to an epitaxial reactor for chemical vapour deposition (CVD), of the kind using an induction heated susceptor, implemented in two discrete reaction chambers alternatively actuated by some power AC generator, preferably but not limited to medium frequency power generators.

It is well known to use epitaxial reactors for CVD deposition of layers on single crystal wafers, specially in the field of semiconductors (Si, GaAs or the like), for producing complex components.

In the above mentioned field the nowadays problem of cost reduction is more and more pressing. The cycle of the CVD deposition consists of the following steps:
Loading step of products (one or more wafers);
Purge step by means of inert and/or reducing gas such as, for example, $N_2$, $H_2$;
Heating up step to increase the temperature from loading to deposition temperature;
Deposition step;
Cooling down step to decrease the temperature from deposition to unloading temperature;
Purge step by means of reducing and/or inert gas such as, for example, $H_2$, $N_2$; and
Unloading step of products (one or more wafers).

The productivity, or production rate in a time unit, of an epitaxial reactor can be increased by affecting both the above single steps and the whole assembly thereof, for example by either increasing the number of reaction chambers contained in a single reactor or increasing the batch load.

In fact, the cost of every epitaxial wafer is affected by some parameters, the most important being:
1. The direct cost of used gas, electric power, materials, etc.;
2. The amortization or redemption share for every produced wafer;
3. The productivity for every surface area unit, i.e. the necessary investment cost for installing every epitaxial reactor.

It is an object of the present invention to reduce the costs connected to the above parameters 2 and 3.

SUMMARY OF THE INVENTION

The subject matter of the present invention is an epitaxial reactor, consisting of two reaction chambers, or stations, mounted on a single support frame, induction heated by a dual output medium frequency generator, wherein just one reaction chamber at a time can be operated while the other one has to carry out purge, loading and unloading steps, having however an overlap between the operating times of the two stations lasting till 20 minutes.

Also the only fact of being provided with two reaction chambers, instead of one, allows to increase the productivity. In fact, a reactor having two stations allows a productivity increase ranging from a minimum of 35% to a maximum of 100% with respect to a reactor having the same features, but just one station and a reaction chamber alone.

The 35 to 100% range is connected to the layer thickness to be deposited, i.e. to the time duration of the deposition step. When the steps of heating up, deposition, cooling down (the last step is taken into account only if the generator has been actuated) have a time duration shorter than or equal to that of the purge, loading/unloading steps, the productivity gain goes to 100%. The solution with two reaction chambers in just one reactor is intrinsically more efficient than the solution with just one reaction chamber.

An alternative approach consists in mounting two completely independent reaction chambers inside a reactor.

Such an approach allows an higher productivity but at price of a higher complication. In fact, requires the presence of two medium frequency generators, a more complex gas control board and generally the doubling of the basic functions. The installation of such a reactor is indeed more complex and, above all, outstandingly expensive. In the here below enclosed Table 1 the productivities or production rates are listed for:

a reactor having just one station and one power generator;
a reactor having two stations and two alternatively actuated power generators, the on time (operating time) of one generator coinciding with the off time (rest time) of the other generator (traditional prior art);
a reactor having two stations and two alternatively actuated generators, according to a design of the present invention, with an overlapping in the operating times of the two stations; and
a reactor having two simultaneously working stations with independently actuated generators (case conventionally called "two reactors in one").

TABLE 1

| Reactors | Productivity (arbitrary units) |
| --- | --- |
| Reactor having just one station | 100 |
| Two station reactor with traditional power generator having one power output for every station (prior art) | 135–200 (+35 to +100%) depending on the duty cycles, i.e. the ratios between on and off times of every station |
| Two station reactor with two alternatively actuated generators and a 1 to 20 minute time overlap in the operations of the two generators (present invention) | 180–250 (+80 to +150%) depending on the duty cycles and the overlap of the operating times of the two stations. |
| Two reactors in one | 200 (+100%) but at a price of higher investment cost and room waste |

The present invention consists of using a medium frequency generator, having the same layout of a traditional generator, but with two independent power outputs, every output being connected to a reaction chamber.

The invention allows not to overburden the installation conditions and not to uselessly complicate the reactor which do not show any further change with respect to the standard reactors.

Substantially, the invention allows, in a reactor comprising two stations or reaction chambers, to either partially or totally overlap the heating up time of the waiting station to the reaction or deposition time of the station performing the process. According to a preferred embodiment of the invention, such an overlap is of 10 minutes, meaning that 10 minutes before the end of the deposition step in the reaction chamber under process (or, more generally, 10 minutes before the end of the working time of the generator for that reaction chamber) power is supplied to the other station (on the related output of the generator) so beginning the heating up step 10 minutes in advance with respect to the traditional process.

Of course, the 10 minute overlap is just an example coinciding this time with the whole time of the heating up step ranging from 1 to 20 minutes, as it is well known in the art. (see for example U.S. Pat. No. 5,037,674 for chemical deposition of GaAs films).

As in the heating up step is expected only the use of inert gas, changes in the gas supply board, already arranged for the simultaneous purge of two reaction chambers, are not required.

More in general no hardware modifications are required, with no increase of the reactor complexity.

The productivity increase depends on the layer thickness but it is at least 20 to 30% of the productivity of the reactor having two stations with a traditional power generator.

DESCRIPTION OF THE DRAWINGS

The features of the invention will be defined in the appended claims. However, further features and advantages of the invention will be specified in detail in the here below enclosed description of an embodiment thereof, wherein:

DETAILED DESCRIPTION OF THE EMBODIMENT

Figure 1:
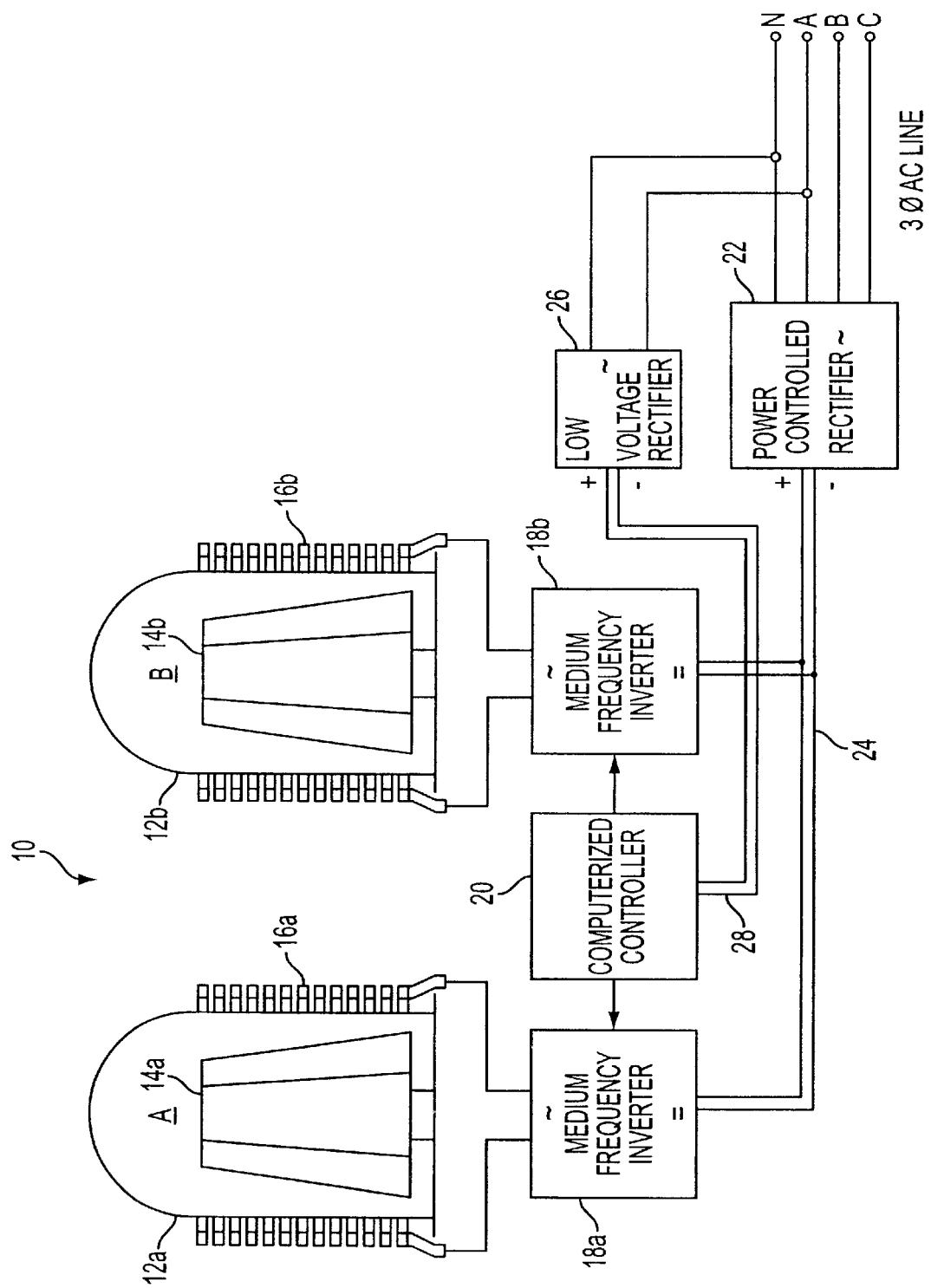
FIG. 1 is an electric schematic diagram of an epitaxial reactor provided with two reaction chambers to be alternatively actuated in accordance with the present invention.

Referring to FIG. 1, an epitaxial reactor 10, according to the present invention, includes two working stations A and B, each comprising a reaction chamber 12a and 12b in the form of a bell jar containing a respective susceptor 14a and 14b, every bell jar being surrounded by an inductor 16a and 16b, respectively. The inductors 16a and 16b are powered by medium frequency power generators in the form of DC-AC inverters 18a and 18b generating medium frequency (1 to 10 kHz and, preferably, 4 kHz) power (of the order of hundreds of kW) energizing the inductors 16a and 16b.

The use of a medium frequency is however only an example, as the same function can be accomplished also with a power generator of higher frequency and, more in general, with power sources other than inductive heating (i.e: IR lamps or similar tools).

Both the inverters 18a and 18b are controlled by a computerized controller 20 carrying out a procedure for alternate actuation of the two reaction chambers 12a and 12b in accordance with the invention. A power controlled rectifier assembly 22, obviously containing an AC three-phase transformer, rectifying diodes, silicon controlled rectifiers (SCR) and obvious accessory components, provides DC electric power (about 500 Volt) to a power supply bus 24 of the inverters 18a and 18b from a three-phase AC line comprising three phase wires A, B and C and a neutral wire N. A low voltage rectifier assembly 26, providing supply voltages, for example 0 to +5 Volt, 0 to +12 or +24 Volt on a power bus 28 of the computerized controller 20 and the related peripheral devices, comprises an AC single-phase transformer, rectifier bridges as well as voltage stabilizers. The low voltage rectifier assembly 26 is connected to a phase wire (for example A) and the neutral wire N.

Figure 2:
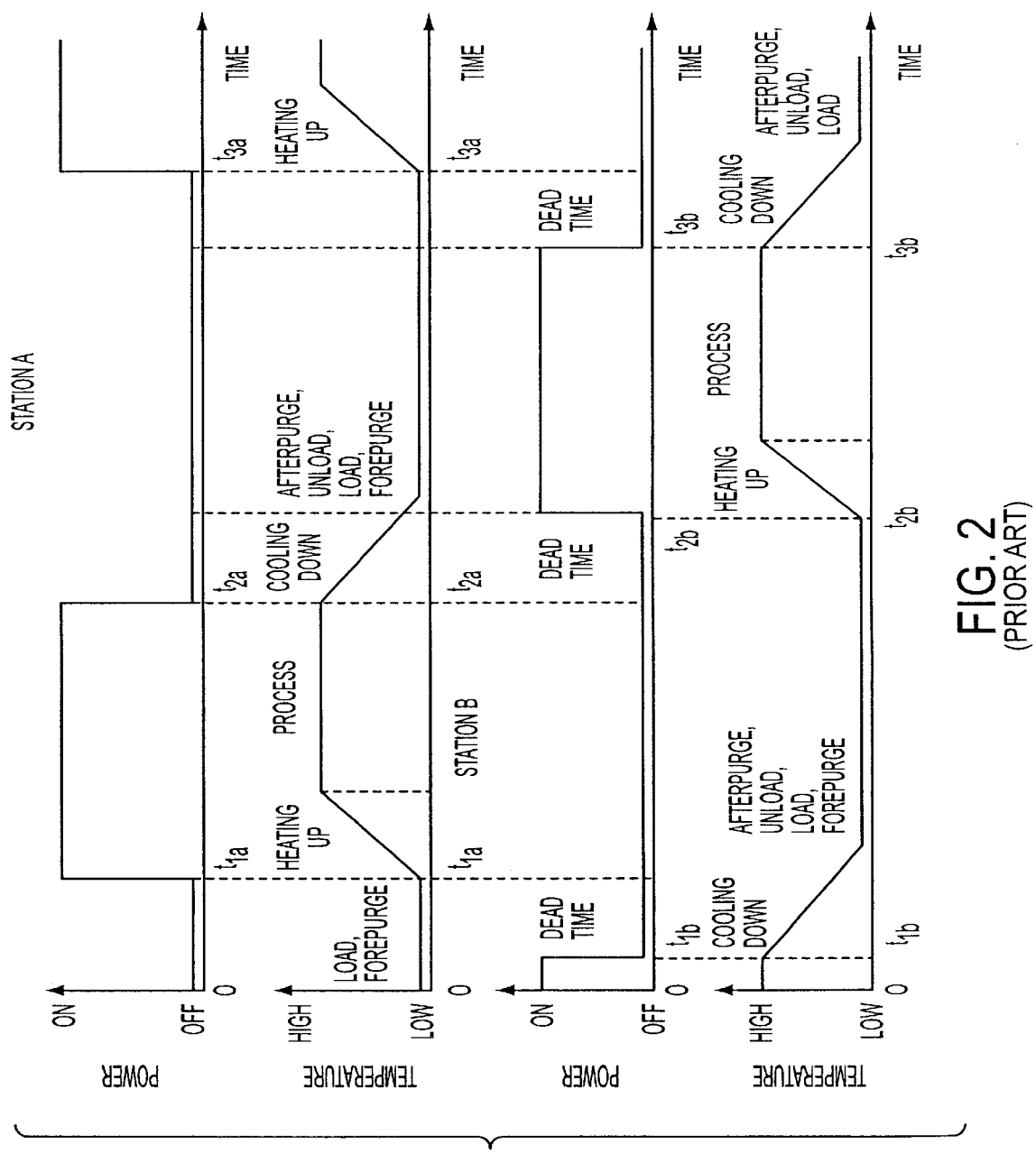
FIG. 2 is a time diagram of the powers and the temperatures in the two reaction chambers according to an actuating method of the prior art.

FIG. 2, depicting a time diagram of the powers and the temperatures in two reaction chambers according to a method of the prior art, shows that when power is turned on in the station A (times $t_{1a}$ to $t_{2a}$ and $t_{3a}$ on), it is turned off in the station B (times $t_{1b}$ to $t_{2b}$ and $t_{3b}$ on) and vice versa. It means that, when in the station A is carried out a deposition process, in the station B are carried out the final operations of a preceding process and the preparing operations of a subsequent deposition process, i.e. cooling off, afterpurging with $H_2$ and $N_2$, unloading of processed wafers, loading of fresh wafers to be processed and forepurging of the station B with $N_2$ and $H_2$. Vice versa, when in the station B is carried out a deposition process, in the station A are carried out the final operations of a preceding process and the preparing operations of a subsequent deposition process. From FIG. 2 it is self-evident that this method of the prior art has the drawback of dead times ($t_{1b}$ to $t_{1a}$, $t_{2a}$ to $t_{2b}$, $t_{3b}$ to $t_{3a}$) reducing the time efficiency and thus the productivity of an epitaxial reactor provided with two station operated according to this method of the prior art. Here the time efficiency is somewhat less than 100% and can, at most, reach the 100% when the times of power on of a station are equal to the times of power off of the other stations, meaning that the dead times are reduced to zero ($t_{1a}$ coincident with $t_{1b}$, $t_{2a}$ coincident with $t_{2b}$ . . . and so on).

Figure 3:
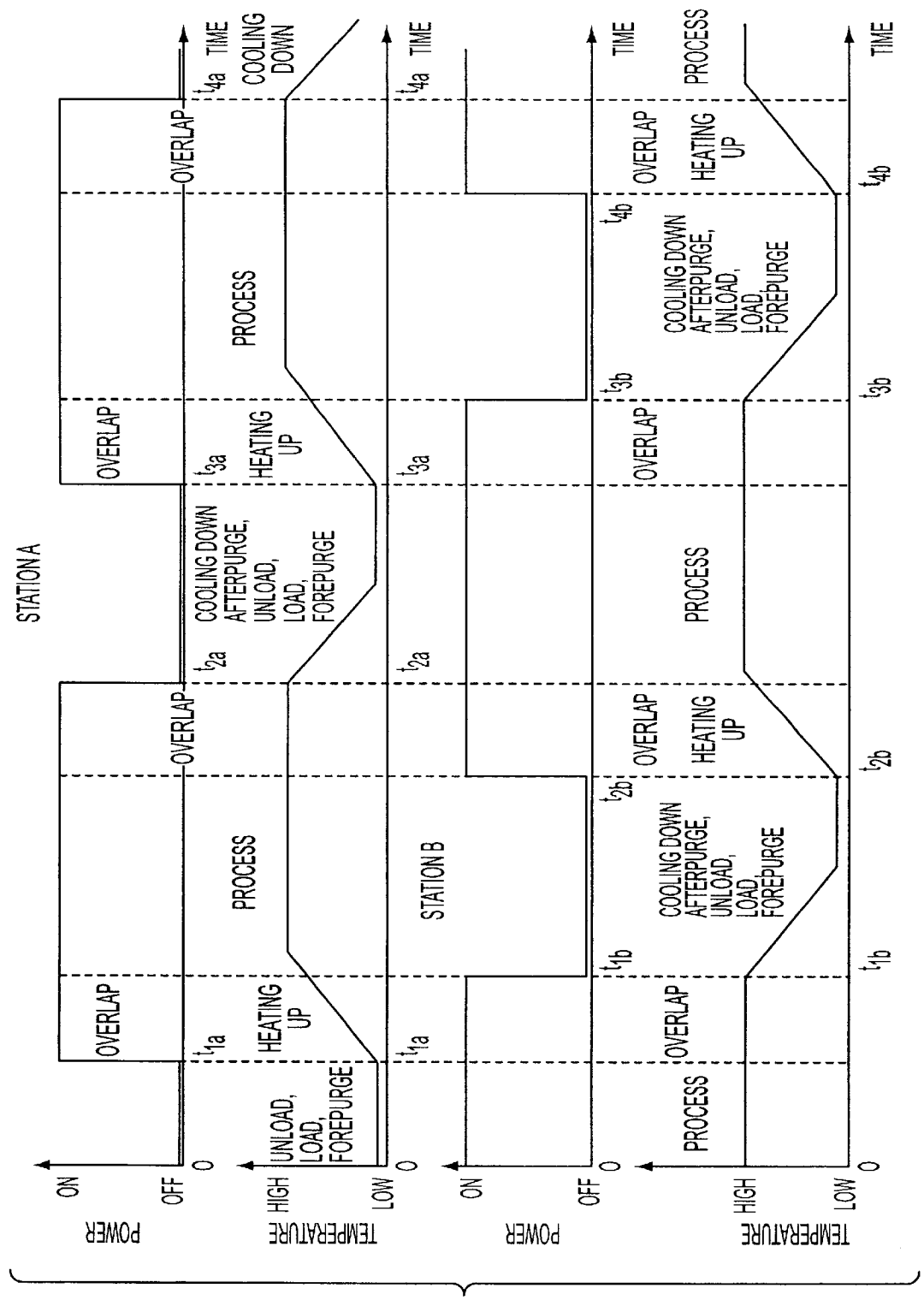
FIG. 3 is a time diagram of the powers and the temperatures in the two reaction chambers according to the actuating method of the invention.

FIG. 3, depicting a time diagram of the powers and the temperatures in two reaction chambers according to the method of the present invention, shows that, when the power is turned on in the station A (times $t_{1a}$ to $t_{2a}$ and $t_{3a}$ to $t_{4a}$), it is still turned on in the station B (times $t_{1a}$ to $t_{1b}$, $t_{2b}$ to $t_{2a}$; $t_{3a}$ to $t_{3b}$, $t_{4b}$ to $t_{4a}$), the time overlaps, indicated as "Overlap" in the drawing, giving the usefulness of the present invention.

It is true that, being the operating times of the two stations A and B and thus the working times of the inverters 18a and 18b partially overlapped, there are times in which both the inverters 18a and 18b are supplied by the power controlled rectifier 22, requiring some oversize thereof, however such an oversize is limited by:

a) the fact that the overlap time always covers the heating up time of every susceptor which, being made of graphite, has a resistivity with negative temperature coefficient (NTC), with lower loading at lower temperatures (when the susceptor is cold) and higher loading at higher temperatures (when the susceptor is hot) and the overlap substantially ends when the susceptor of the station, beginning to operate, is at the working temperature;

b) independently controlling the DC supply voltage to every inverter 18a and 18b in order to have a total load less than two times the maximum load of every station A and B.

It means that the power rating of the rectifier assembly 22 is well less than two times the power needed by just one station either A or B (+50 to 75% power oversizing being usual in this case).

Figure 4:
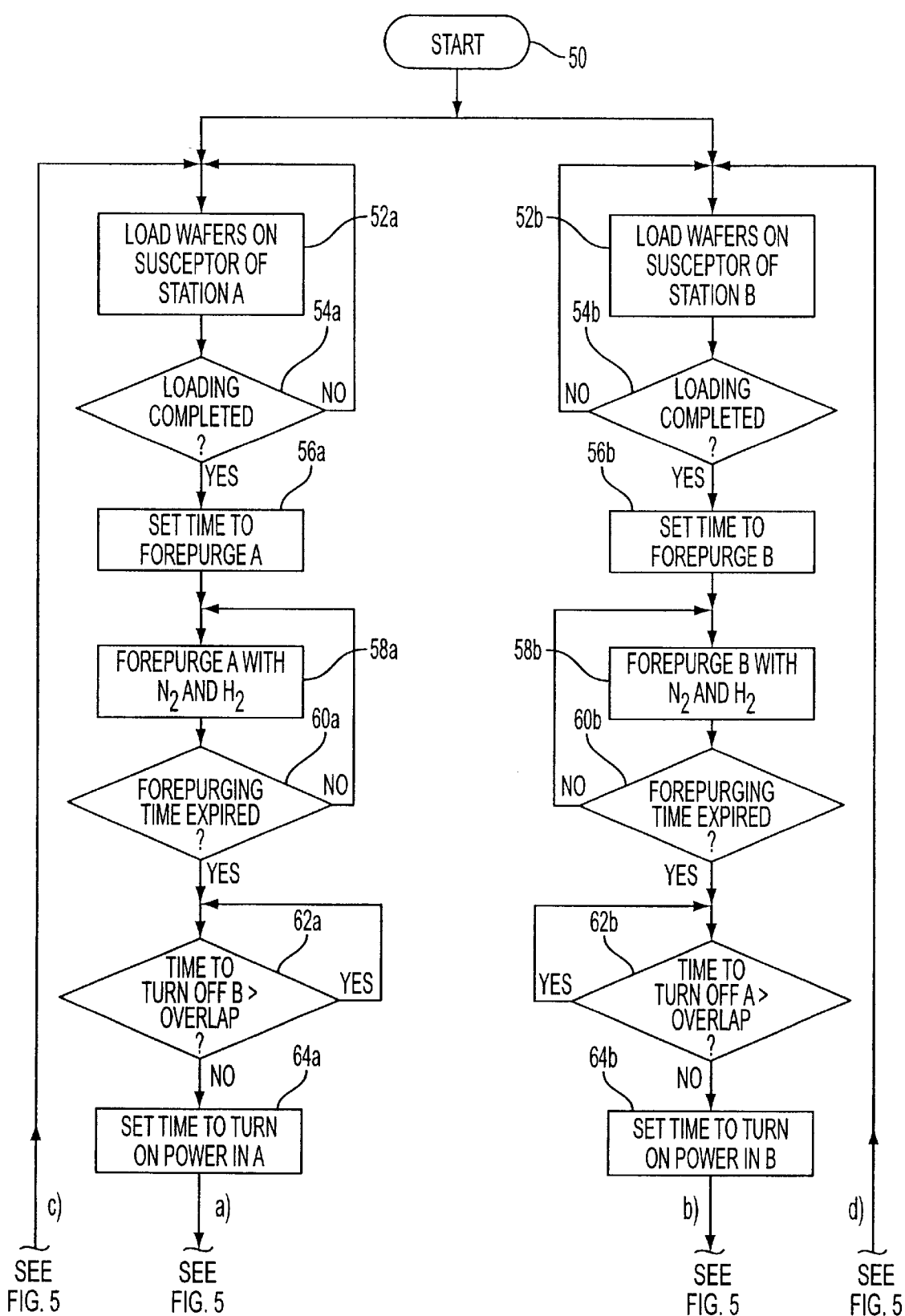
FIG. 4 depicts a first portion of a simplified flow chart of part of the software of the computerized controller controlling the operations of an epitaxial reactor, provided with two reaction chambers or stations according to the invention.
Figure 5:
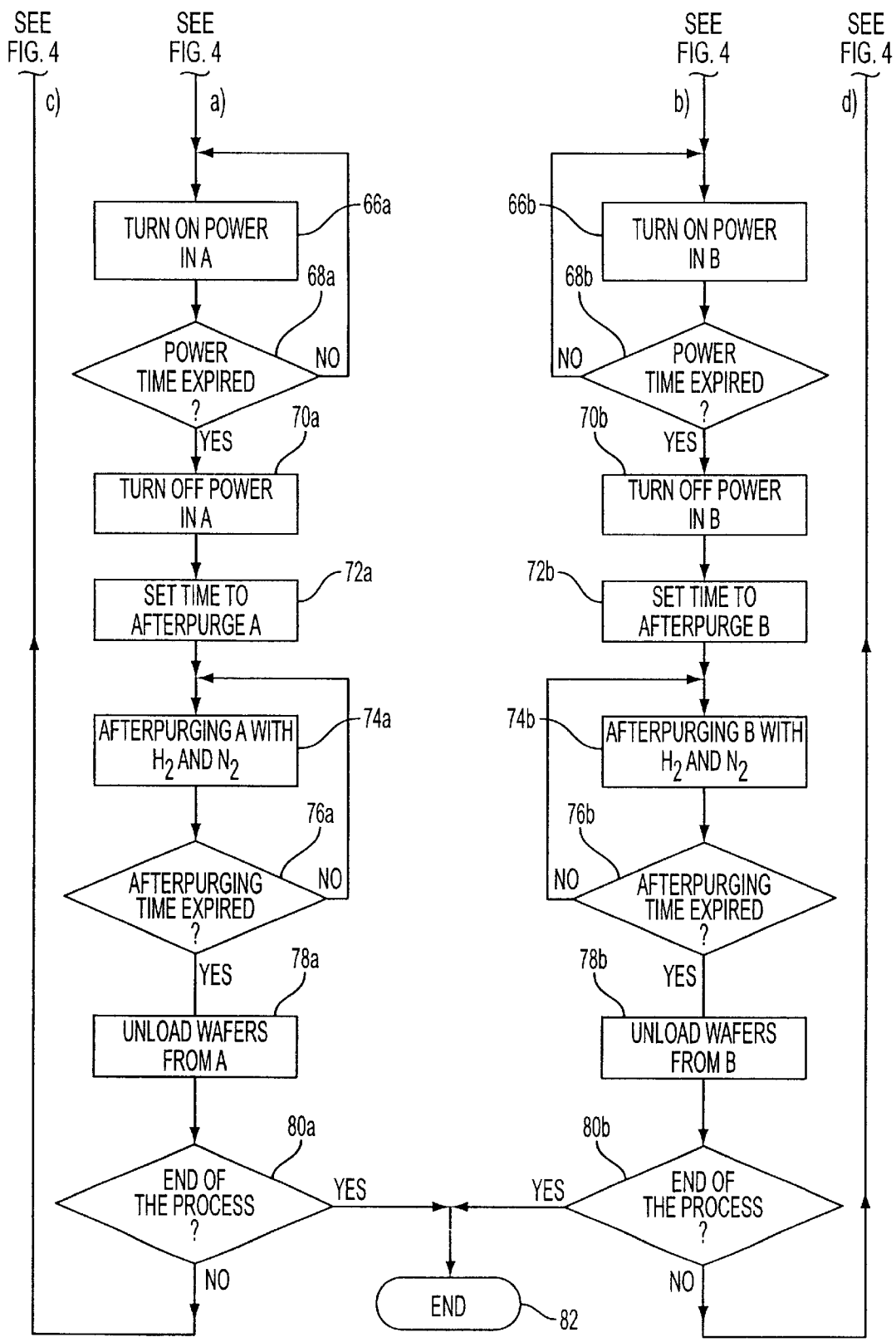
FIG. 5 depicts a second portion of the same simplified flow chart.

Looking at FIGS. 4 and 5, it is here depicted a simplified flow chart of part of the software inserted in the computerized controller 20 controlling the operations of the epitaxial reactor according to the invention carrying out the operations depicted in FIG. 3.

Looking at FIG. 4, it is seen that the program managing the operations of the reactor 10 begins with a START order 50, then it is branched to two action blocks 52a and 52b executing the loading of wafers on the susceptors 14a and 14b of both stations A and B. Two decision blocks 54a and 54b check if the loading operations are completed. If NO, the loading operations are repeated, if YES, the program goes to action blocks 56a and 56b setting times for the forepurging of both stations A and B (the term "forepurging" stands for a purging of every station "before" an epitaxial deposition process on any wafer). After having set the forepurging times, the program goes to action blocks 58a and 58b of purging both the stations A and B by flowing first nitrogen ($N_2$), then hydrogen ($H_2$) through the bell jars 12a and 12b of both stations A and B. Then the program goes to decision blocks 60a and 60b checking if the forepurging times are expired. If NO, the purging operation is repeated. If YES, the program goes to decision blocks 62a and 62b checking if the remaining time to turn off power to the other station (B for the station A and A for the station B) is longer (>) than the overlap time decided for the two operations. If YES, the program waits for the expire of that time. If NO, the program goes to the action blocks 64a and 64b setting the turn on times for the power to both stations A and B.

Referring now to FIG. 5, it is seen that the program continues with the action blocks 66a and 66b turing on power in the stations A and B, respectively. Decision blocks 68a and 68b check if the times for powering the stations A and B are expired. If NO, the powering continues. If YES, the powering is turned off by action blocks 70a and 70b, beginning the cooling off of the stations A and B. Further action blocks 72a and 72b set the times for afterpurging (purging after the process) the stations A and B. Action blocks 74a and 74b carry out the afterpurging, first with $H_2$, then with $N_2$, of the wafers in the stations A and B. Decision blocks 76a and 76b check if the afterpurging times expired. If NO, the afterpurging is continued. If YES, the program continues by unloading the wafers from the stations A and B at the action blocks 78a and 78b. Further decision blocks 80a and 80b decide if the process has either to end or continue. If it has to end, answer YES, the program goes to the order END. If it has to continue, it comes back to the action blocks 52a and 52b in FIG. 4.

Here it is to realize that, apparently, the program seems to flow simultaneously along the two branches "a" and "b", but it is sufficient to begin one of the actions in advance with respect to the other (for example the loading of wafers in the station A according to the block 52a) for having the two process on the stations A and B offset in the time, with the time overlap of the process (power turned on in A and B) decided by the decision blocks 62a and 62b, as depicted by FIG. 3. Of course, the time advance of the process could be given to the station B instead of station A without going out from the scope of the invention.

Further, it is to realize that the program of FIGS. 4 and 5 also allows the two stations A and B to operate independently, because should the decision block 80b decide the end of the process in the station B, the process can continue in the branch "a" (regarding the operation of the station A) through recycling thereof to the action block 52a and vice versa. It means that, if for some reason, for example servicing or repairs, one of the station must be shut down, the program allows the other station to operate independently, the only disadvantage being the lost of the time overlap of the process affecting the productivity.

What has been here above stated is just an embodiment of the invention not to be construed as limiting the scope thereof, the coverage of this patent application being defined by the appended claims.

For example, as already stated, instead of the inductive heating, to heat the susceptors of both the stations A and B, can be used IR lamps, or the like, because the program depicted in FIGS. 4 and 5 operates equally well, with both DC to AC inverters and controlled power suppliers for electric lamps directly connected to an electric main.

What is claimed is:

1. An epitaxial reactor comprised of a first and a second reaction chamber or station, coupled on a single support frame, operated by a dual output power generator, wherein the first reaction chamber can be operated at one time while the second reaction chamber has to carry out a purge step, a loading step and an unloading step, having a time overlap between an operating time of the first reaction chamber and an operating time of the second operating chamber beginning when the first reaction chamber is still operating and ending when a susceptor of the second reaction chamber is at a working temperature.

2. The epitaxial reactor of claim 1, wherein the time overlap is between 1 and 20 minutes.

3. The epitaxial reactor of claim 2, wherein the first and second reaction chambers are induction heated by an induction coil supplied by a medium frequency AC power generator comprising two alternatively actuated solid state inverters, so that when the first reaction chamber is heated for carrying out a deposition process, the second reaction chamber is purged, loaded and unloaded resulting in the time overlap lasting for 10 minutes.

4. The epitaxial reactor of claim 3, wherein the medium frequency AC power generator is further comprised of a pair of DC to AC inverters supplied by a rectifier assembly connected to an electric main and controlled by a computerized controller.

5. The epitaxial reactor of claim 4, wherein the rectifier assembly further comprises a rectifier bridge containing silicon rectifier diodes.

6. The epitaxial reactor of claim 4, wherein the rectifier assembly further comprises a rectifier bridge containing silicon rectifier diodes and silicon controlled rectifiers (SCR).

7. The epitaxial reactor of claim 4, wherein the rectifier assembly further comprises a rectifier bridge containing silicon controlled rectifiers (SCR).

8. The epitaxial reactor of claim 4, wherein the induction coils are powered by a controlled DC voltage supplied to the pair of DC to AC inverters.

9. The epitaxial reactor of claim 8, wherein the controlled DC voltage is controlled by the rectifier assembly and the rectifier assembly is connected to the electric main.

10. The epitaxial reactor of claim 4, wherein the induction coils are powered by a controlled duty cycle to the pair of DC to AC inverters.

11. The epitaxial reactor of claim 10, wherein the computerized controller begins to actuate the first reaction chamber by a loading a first set of one or more wafers into the first reaction chamber, purging the first reaction chamber, powering a susceptor of the first reaction chamber for a time period, cooling the susceptor of the first reaction chamber, the computerized controller begins to actuate the second reaction chamber, before the susceptor of the first reaction chamber is cooled, by loading a second set of one or more wafers into the second reaction chamber, purging the second reaction chamber, powering the susceptor of the second reaction chamber, obtaining a time overlap between the powering of the first and second reaction chambers.

12. The method of claim 11, wherein the computerized controller can shut down the first or second reaction chamber and operate the un-shut down reaction chamber independently.

13. The epitaxial reactor of claim 4, wherein the computerized controller begins to actuate the first reaction chamber by a loading a first set of one or more wafers into the first reaction chamber, purging the first reaction chamber, powering a susceptor of the first reaction chamber for a time period, cooling the susceptor of the first reaction chamber; the computerized controller begins to actuate the second reaction chamber, before the susceptor of the first reaction chamber is cooled, by loading a second set of one or more wafers into the second reaction chamber, purging the second reaction chamber, powering the susceptor of the second reaction chamber, obtaining a time overlap between the powering of the first and second reaction chambers.

14. The method of claim 13, wherein the computerized controller can shut down the first or second reaction chamber and operate the un-shut down reaction chamber independently.

* * * * *